(12) United States Patent
Bellessort

(10) Patent No.: US 8,464,231 B2
(45) Date of Patent: Jun. 11, 2013

(54) METHOD AND APPARATUS FOR ACCESSING A PRODUCTION FORMING A SET OF RULES FOR CONSTRUCTING HIERARCHICAL DATA OF A STRUCTURED DOCUMENT

(75) Inventor: Romain Bellessort, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 1157 days.

(21) Appl. No.: 12/369,432

(22) Filed: Feb. 11, 2009

(65) Prior Publication Data

US 2009/0210783 A1    Aug. 20, 2009

(30) Foreign Application Priority Data

Feb. 15, 2008 (FR) ..................... 08 50988

(51) Int. Cl.
*G06F 9/45* (2006.01)
(52) U.S. Cl.
USPC ........................................... 717/142
(58) Field of Classification Search
USPC ........................................... 717/142
See application file for complete search history.

(56) References Cited

U.S. PATENT DOCUMENTS

| | | | |
|---|---|---|---|
| 2005/0240859 A1* | 10/2005 | Bodin et al. | 715/500.1 |
| 2007/0022373 A1 | 1/2007 | Chidlovskii et al. | 715/513 |
| 2007/0168119 A1* | 7/2007 | Mori | 701/207 |
| 2007/0220063 A1* | 9/2007 | O'Farrell et al. | 707/201 |
| 2008/0028375 A1* | 1/2008 | Matsa et al. | 717/141 |
| 2009/0044098 A1* | 2/2009 | Wyler et al. | 715/234 |

FOREIGN PATENT DOCUMENTS

WO     WO 2006/056974 A2    6/2006

OTHER PUBLICATIONS

J. Schneider et al., "Efficient XML Interchange (EXI) Format 1.0", Dec. 19, 2007, www.w3.org/TR/2007/WD-exi-20071219/>, 91 sheets.

G Leighton et al., "A Grammar-based Approach for Compressing XML", Technical Report, Jodrey School of Computer Science, Acadia University, Canada, http://cs.acadiau.ca/research/technicalReports/files/tr-2005-004.pdf>, 18 sheets.

Girardot et al., "Millau: An Encoding Format for Efficient Representation and Exchange of XML Over the Web", Computer Networks 33, Elsevier Science Publishers B.V., vol. 33, pp. 747-765 (2000).

(Continued)

*Primary Examiner* — Chun-Kuan Lee
*Assistant Examiner* — Brooke Taylor
(74) *Attorney, Agent, or Firm* — Fitzpatrick, Cella, Harper & Scinto

(57) ABSTRACT

A method and apparatus access a production among first and second groups of productions. The productions form rules for constructing hierarchical data of a structured electronic document. The first group is associated with a first group of events, each production being defined for an event type and contextual information including a name associated with an element in the hierarchical data. The second group is associated with a second group of events distinct from the first group of events, the events of the second group describing the hierarchical data of the structured electronic document. The device determines whether an event is of the first group including determining whether the event in question is defined by a name associated with an element in addition to an event type, and predicts a production from the second group that is associated with the event is determined to be of the first group.

23 Claims, 6 Drawing Sheets

OTHER PUBLICATIONS

W. Li: "XCOMP: An XML Compression Tool", MSC Thesis, University of Waterloo, Ontario, Canada, http://softbase.uwaterloo.ca/{ddbms/publications/distdb/Weimin.pdf>, 86 pages.

French International Preliminary Search Report of French Application No. 0850988.

* cited by examiner

METHOD AND APPARATUS FOR ACCESSING A PRODUCTION FORMING A SET OF RULES FOR CONSTRUCTING HIERARCHICAL DATA OF A STRUCTURED DOCUMENT

CROSS-REFERENCE TO RELATED APPLICATIONS

Not applicable.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

INCORPORATION-BY-REFERENCE

This application claims priority from French patent application Ser. No. 08/50988 filed on Feb. 15, 2008, the entire contents of which are incorporated in the disclosure of the present application.

BACKGROUND OF THE INVENTION

1. Field of the Invention

The present invention concerns a method and a device for processing structured documents. It applies in particular to the XML language (the acronym for "Extensible Markup Language", meaning extensible markup language). This language is a syntax for defining computer languages. XML thus makes it possible to create languages adapted to different uses but able to be processed by the same tools.

2. Description of the Related Art Including Information Disclosed Under 37 CFR 1.97 and 37 CFR 1.98

An XML document is composed of elements, each element commencing with an opening tag comprising the element name (for example: <tag>) and terminating in a closing tag comprising, also, the name of the element (for example: </tag>). Each element can contain other elements in a hierarchical fashion or text data.

In addition, an element can be specified by attributes, each attribute being defined by a name and having a value. The attributes are placed in the opening tag of the element that they specify (for example: <tag attribute="value">).

XML syntax also makes it possible to define comments (for example: ←Comment→) and processing instructions, which may specify to a computer application the processing operations to be applied to the XML document (for example: "<?myprocessing?>"), as well as escape sections that prevent a section of text being interpreted as a tag when it has the form (for example:

"<![CDATA[<text>Escape</text>]]>" where <text> is recognized as a character string rather than a tag).

In XML terminology, all the terms "element", "attribute", "text data", "comment", "processing instruction" and "escape section" are grouped together under the generic name "item". In a more general context, all these terms (forming for example the element defined between an opening tag and a closing tag) can be grouped together under the generic name "node".

This XML data can be described in terms of events. Thus an event would correspond to each part of a document. For an element <tag></tag>, a "Start of element" event will be distinguished first of all, this event being characterized by the name "tag", then an "End of element" event which, according to the topology of markup languages, contains a reminder of the corresponding element name, here "/tag", but nevertheless appears independent since an "End of element" element conventionally terminates the last-opened element. The other most frequent events are the "Character" events for text data, "Comment" for comments, or "Attribute" for attributes.

Several different languages based on XML may contain elements with the same name. In order to be able to mix several different languages, an addition has been made to XML syntax for defining namespaces ("Namespace" according to English terminology). Two elements are identical only if they have the same name and are situated in the same namespace. A namespace is defined by a URI (the acronym for "Uniform Resource Identifier"), for example "http://canon.crf.fr/xml/mylanguage". The use of a namespace in an XML document requires the definition of a prefix that is a shortcut to the URI of this namespace. This prefix is defined by means of a specific attribute (for example: "xmlns:ml=http://canon.crf.rf/xml/mylanguage" associates the prefix "ml" with the URI "http://canon.crf.rf/xml/mylanguage"). Next, the namespace of an element or attribute is specified by causing its name to be preceded by the prefix associated with the namespace followed by ":" (for example: "<ml:tag ml:attribute="value">" indicates that the element tag stems from the namespace ml and that the same applies for the attribute attribute).

In certain cases, the above XML elements or data are processed by computer by means of an appropriate language description, called grammar.

This description is based on various rules, also referred to as productions, and by combining these productions it is possible, as desired, to check that data is in conformity with this grammar, or to generate data in conformity with this grammar, for example in order to encode this data.

Solely for purposes of illustration, the following example is taken composed of an alphabet of two symbols, A and B, a symbol X as a starting symbol and two productions:

P0: X→AX
P1: X→B

Starting from X, AX is obtained by using the production P0. If the production P0 is applied again, AAX is obtained. Then the production P1 is applied, and AAB is obtained. The language generated by this grammar is all the strings consisting of a certain number of As and then a B.

Thus productions and grammars constitute a set of rules for constructing a document of hierarchical data, here an XML file.

The use of grammars is advantageous for certain operations performed on XML data, two examples of which will be provided below.

The first example relates to the validation of XML data. According to this, it is checked that the content of an XML document corresponds to a model. This model is described in what is termed a schema. Thus, according to one example, a schema may define an element book by specifying that a book contains a reference, a title, an author and a publication date: in addition, the element author can be defined as containing lastname, a first name and a date of birth.

A schema being known, it is therefore possible to evaluate the conformity of an XML document with respect to this schema. A conventional method for proceeding with this evaluation is based on the use of grammars: from the schema, grammars are constructed, each grammar containing the productions corresponding to the possible events according to the schema. If no order is specified between the reference, the title, the author and the publication date, the content of an element book is described by a grammar containing a production for each of these elements (in the case of any constraint, in particular a constraint of order, it is necessary to provide a more complex grammar that allows only the sequences corresponding to these constraints). If data is encountered that correspond to none of these productions, then the data is not in conformity and the validation fails.

The second example is that of the compression of XML data. XML data is text data that is generally redundant, and thus it is useful to compress it. The most conventional method for compressing XML data consists of replacing the XML tags with codes. Thus it can be decided that, for a start of element book, the hexadecimal code 0x01 is used, while for a start of element author, 0x02 is used, and the code 0xFF for its part designates the end of an element. However, with this type of encoding, compression is not optimal since, whatever the current context, a code always has the same meaning. However, according to the context, only certain events can occur. Let us take the example of the element book and the element author: if the XML document presents a list of books, then it is logical for the element author to appear only within an element book, the author being seen in this case as a characteristic of the book. Consequently it can be considered that it is not useful to reserve the code 0x02 for author when not in a book, since it is assumed that in this context the element author would not occur.

One solution for improving this technique is based on the use of the grammars presented above. This is particularly the case with "efficient XML", the format used as a basis for the standardization of a binary XML format by the EXI (the acronym for "Efficient XML Interchange") working group of the W3C (the acronym for "World Wide Web Consortium", the organization producing standards for the Web) disclosed in the publication "*EXI Format* 1.0—*W3C working draft of Dec.* 19, 2007" by J. Schneider. The EXI format takes account of the order of appearance of the various items within a document in order to construct a grammar that makes it possible to encode the most frequent items in a small number of bits. With each element, a grammar is associated that describes the data liable to be encountered within this element. For each type of data, that is to say for each type of event within this context element, a production is inserted in the grammar and a code is associated with this production. In this way, the codes used for coding the data depend on the context, which makes it possible to use codes of smaller size. In the case of book and author the grammar associated with the element book comprises a production describing the start of the element author, and the other grammars do not contain such a production.

As specified in the publication, the events or items dealt by a production are defined by an event type (for example a start of an element, an attribute, a character, etc.) and depending on the event type, an item of content (value, text, etc.) or a qualified name.

When data thus structured is processed using grammars, it is known conventionally how to seek the production describing a data item, corresponding to an event in the context element, using a hash table. This table associates keys, corresponding to the data, with objects, corresponding to the productions. Thus, from a data item in the element, a number is calculated using a hash function. The production describing the data item is then found in the table at the index corresponding to the number obtained. The access times to a hash table are on average satisfactory.

Nevertheless, the defect in solution lies in the expensive calculation, in terms of time and resources, of the hash value using a hash function.

Alternative solutions have been proposed for accessing the productions describing the data in an element. In particular probabilistic grammars are known in which a probability is associated with each production and from which the production that has the most chance of being used is determined.

These probabilistic grammars do however have the drawback of requiring learning by means of a certain number of prior structured documents, as illustrated by the patent application US 2007/0 022 373. This learning also gives rise to significant costs prior to the processing of a structure document and does not allow the effective processing of documents with different origins, in particular if the document to be processed does not have a structure close to those of the learning documents.

Thus the problem is posed of knowing how to more effectively obtain a production for an event to be processed.

BRIEF SUMMARY OF THE INVENTION

The invention aims to remedy the drawbacks mentioned above by proposing a processing of hierarchical data using a distinction between at least two sets of events to be processed, for example those that have contextual properties and those that do not, and by making a prediction for a set of events having a contextual nature.

To this end, the invention relates in particular to a method of accessing a production among a plurality of productions of at least one grammar, the plurality of productions comprising a first group of productions associated with a first group of events each defined by an event type and contextual information, and a second group of productions associated with a second group of events distinct from the first group, the events describing hierarchical data of a structured electronic document, the method comprising:

a) a step consisting of determining whether an event in question is of the first group; and b) if the outcome of step a) is in the affirmative, the method performs a step of predicting a production associated with the event in question.

Once the production is obtained, it is easy to set up a specific processing as indicated previously.

Thus, by differentiating at least two groups of events and productions according in particular to the presence or not of complementary contextual information (which is generally in the form of a property of an event type), it is possible to apply a targeted search, with for example a simplified search for general events of all the hierarchical data and an adapted search with prediction for the events highly dependent on the context in which they fit. In the case of prediction, the calculation of hash values of the prior art is thus avoided. By thus saving on calculation, the required productions are accessed globally at less cost and more rapidly.

The method applies to any type of structured electronic document, in particular digital files, for example of the XML type.

The belonging of an event to a specific group makes it possible to define the processing to be applied to the event in question according, where applicable, to the contextual information to which it is attached.

The events in the first group have contextual information in addition to a type of event. Thus, for an identical type of event, for example the type of event "start of element", two events in this group may differ when, amongst other things, the name of the element to which they relate is considered. This name makes it possible in particular to indicate the linked grammars and productions. These events associated with so-called "qualified" productions, here the first group of productions, as will be seen subsequently, thus contain at least one item of contextual information that is a property of the event other than its type.

Conversely, the events in the second group have generic functions for all or part of the document, corresponding to a grammar. This may be the case for example with events based on the type of event of the character or end of element type. Because of this genericness, the corresponding productions do not take account of any properties specified in these events, so that these events are assimilated to their simple function, that is to say generally solely the type of event. These events are described by so-called "simple" productions, here the second group of productions, as will be seen below.

In the example of EXI format above, the so-called "contextual" productions are those comprising a content or qualified name which reveals information about the structure of the XML document itself. In contrast, the other productions are those defined only by an event type (e.g. an end of element) and those with content that only reflects the semantic content of the document itself and not the structure of it (e.g. a character-type event having a string of character to represent an item of content of the document).

In particular, the contextual information may comprise, in the event, a name associated with an element of the hierarchical data, for example either directly the name of the element (including possibly the namespace) or the name of an attribute applicable to this element (including also the namespace where applicable), so that the production associated with the event is defined in or as a function of the context of the element.

This arrangement also includes the case of textual events which may take a limited number of distinct values, in particular two distinct values. The contextual information is in this case the value taken by the event in question, an associated specific production having been provided for each of the possible values.

On the other hand, it is noted that an event not linked to an element so that its descriptive production is not a function of the element, does not come within the context of the events having such contextual information, this is the case in particular with end of element tags.

Hereinafter, an element or attribute name that thus defines contextual information will be called a "qualified name", in order to avoid ambiguities between different usages of the word "name".

As indicated above, if the prediction is true, the processing of the event in question is carried out in accordance with the predicted production.

In this regard, it is envisaged that the method comprises a step of verifying the prediction, the verification being able to consist of a comparison between the event in question and the event described by the predicted production, in particular between the qualified name of the event in question and the qualified name of the predicted production.

Thus, in the case of negative verification, a step of determining a production by means of a hash table is provided, which corresponds to the conventional mechanisms. By virtue of this provision, it is ensured that the processing of an event according to the invention is at worst (therefore in the case of failure of the prediction) only slightly more expensive than that of the prior art using hash tables.

In addition, in this case, an updating of prediction information is provided, in order to improve the future prediction for the rest of the document. This information will be specified later in the description. Provision is also made for this updating step to be able to take place even in the absence of error in the prediction. This is in particular the case when account is taken of the ratio between the predictions and the erroneous predictions in order to carry out this updating.

In one embodiment, in the case of negative determination at step a) (the case of an event in the second group described by a simple production), the method comprises the determination of a production associated with the event in question and comprising the calculation of identification data for the event in question and the recovery of a production in a table from the identification data. In particular, if use is made of the XML processing model StAX (streaming XML programming interface or "Streaming API for XML" according to the English terminology), the identification data for the event in question can correspond to the value of the number of this event in the StAX model. By way of example, the StAX number of the "character" event is 4. Equally, the productions in the second group (that is to say with no context) are stored in a table, each at the index corresponding to the identification data, in particular the StAX value of the associated event. It should be stated here that, when there are several grammars, it is possible to set out a table grouping together the simple productions for each of the grammars.

The invention also relates to a method of processing an electronic document comprising hierarchical data organized in a plurality of items or elements able to be described by a set of events using at least one grammar comprising productions, the method comprising:

i) a step of extracting an event to be processed; and ii) a step of accessing a production associated with the event to be processed in accordance with the above access method.

By way of illustration, the extraction can be carried out conventionally by means of a syntactic analyzer (also called parser), for example XML in the case of a document with the same format.

In particular steps i) and ii) are reiterated for a plurality of events of the document.

In one embodiment, the grammar comprises at least one transition associating, in particular unidirectionally, a so-called "preceding" production with a so-called "following" production, the prediction at step b) comprising the determination of a following production associated with a production describing an event processed during a preceding iteration. The use of transitions offers an inexpensive representation of the sequence of XML-type events in a document. Access to a production and processing of the corresponding event are then made more effective.

In particular, the events of the document are grouped together in different types, the prediction of an event of one type being made from the production associated with the last event of the same type processed. There are in particular events of the attribute type, events of the start of element type and possibly textual events taking one value from a limited number of distinct values. By virtue of these provisions a more effective prediction is ensured since concatenations on events of the same type are generally more homogeneous and redundant than between events of distinct types.

As an alternative, it is possible to make provision for taking the last event processed during the previous iteration, without taking account of the type of event.

According to two embodiments envisaged, the transition is stored in a structure of the previous production or the transition is stored in a table of transitions, in which case there are available as many tables as there are types of event when a typed prediction is made.

In an embodiment relating to the updating of prediction information as introduced above, it is possible to make provision for the updating to comprise the storage of a transition between the production associated with the previously processed event and the production determined by means of the hash table. By virtue of these provisions, in the case of limited redundancy in the XML-type document, the prediction criteria and therefore the efficacy of the latter are changed. In this way access is gained more rapidly to the productions. In particular, the updating may comprise the substitution of the transition to be stored for an already existing transition, these two transitions being effectively concurrent in that they have the same preceding production equal to the production associated with the previously processed event.

In general, this updating is carried out routinely as soon as a prediction is not correct.

However, it is envisaged that the storage of the transition depends on at least one predefined parameter. In particular, a predefined parameter may be a ratio and a corresponding threshold value of the number of occurrences, in the XML-type document, between the transition and a concurrent transition, that is to say a transition starting from the same preceding production towards a different following production.

As an alternative, provision can be made for the transition to be stored definitively and not to be replaced by an alternative concurrent transition.

In one embodiment, the method comprises a step of inactivating a transition, hereinafter referred to as an "opaque transition". This property makes it possible to take account for example of an excessively large number of erroneous predictions. This transition may possibly be replaced subsequently.

In particular the inactivation step depends on at least one predefined parameter. In particular a predefined parameter may be a ratio and a corresponding threshold value, between the number of predictions made from the preceding production and the number of failures encountered. It is possible also to envisage taking account of this ratio only when the number of predictions reaches a threshold value. As an alternative to the ratio, it is possible to take account solely of the number of failures and a threshold as from which the transition is made inactive.

In an embodiment in which the prediction is verified, provision is made for:

α) in the case of negative verification, determining whether the production associated with the previously processed event may be repeated, and β) in the case of positive determination at step α), comparing the event associated with the previously processed production with the extracted event.

Thus, in the case of negative comparison at step β), a production associated with the extracted event is determined from a hash table, and the prediction information is if necessary updated. In the case of positive comparison at step β), the production associated with the event to be processed is already available.

In addition, provision is made, in the case of negative determination at step a), for the determination of a production associated with the extracted event from a hash table, for the comparison between the production associated with the previously processed event and the production obtained from the hash table and for the updating of a repetition indicator, of the flag type, in the production in the case of positive comparison. This indicator is thus useful in the step consisting of determining whether a production may be repeated, by simple reading.

In one embodiment, the grammar and production are formed along with the processing of the data of the document. Thus a dynamic method is procured that adapts to each new document to be processed without requiring any prior learning.

The invention also relates to a device for access to a production among a plurality of productions of at least one grammar, the plurality of productions comprising a first group of productions associated with a first group of events each defined by an event type and contextual information, and a second group of productions associated with a second group of events distinct from the first group, the events describing hierarchical data of a structured electronic document, the device comprising:

a first determination means able to determine whether an event in question is of the first group, and a prediction means able to predict a production associated with an event of the first group.

According to one embodiment, the prediction means comprises transitions associating a so-called "preceding" production with a so-called "following" production, the prediction means being able to determine the following production associated with a production describing a previously processed event.

In particular, the prediction means comprises at least one table referencing the transitions.

In a variant, at least one production references a following production so as to implicitly form one of the transitions.

In one embodiment, the device comprises a means of verifying the predictions of the prediction means and a second means of determining a production able to determine a production from a hash table when the prediction is erroneous.

According to another particular characteristic of the invention, the device comprises a third means of determining a production associated with an event of the second group, the third determination means comprising a table associating, with a data item identifying an event, a production describing the event.

Optionally, the device can comprise means relating to the characteristics of the access and processing methods disclosed previously.

The invention also concerns a device for processing an electronic document comprising hierarchical data organized as a plurality of items or elements able to be described by a set of events using at least one grammar comprising productions, the device comprising:

a means of extracting an event to be processed; and a device for accessing a production associated with the event to be processed as introduced above.

Optionally, the device can comprise means relating to the characteristics of the processing method disclosed previously.

An information storage means, possibly totally or partially removable, able to be read by a computer system, comprises instructions for a computer program adapted to implement the accessing or processing method according to the invention when this program is loaded into and executed by the computer system.

A computer program that can be read by a microprocessor comprises portions of software code adapted to implement the accessing or processing method according to the invention, when it is loaded and executed by the microprocessor.

The information storage means and computer program have characteristics and advantages similar to the methods that they implement.

BRIEF DESCRIPTION OF THE SEVERAL VIEWS OF THE DRAWING(S

Other particularities and advantages of the invention will also emerge from the following description, illustrated by the accompanying drawings, in which.

DETAILED DESCRIPTION OF THE INVENTION

Figure 1:
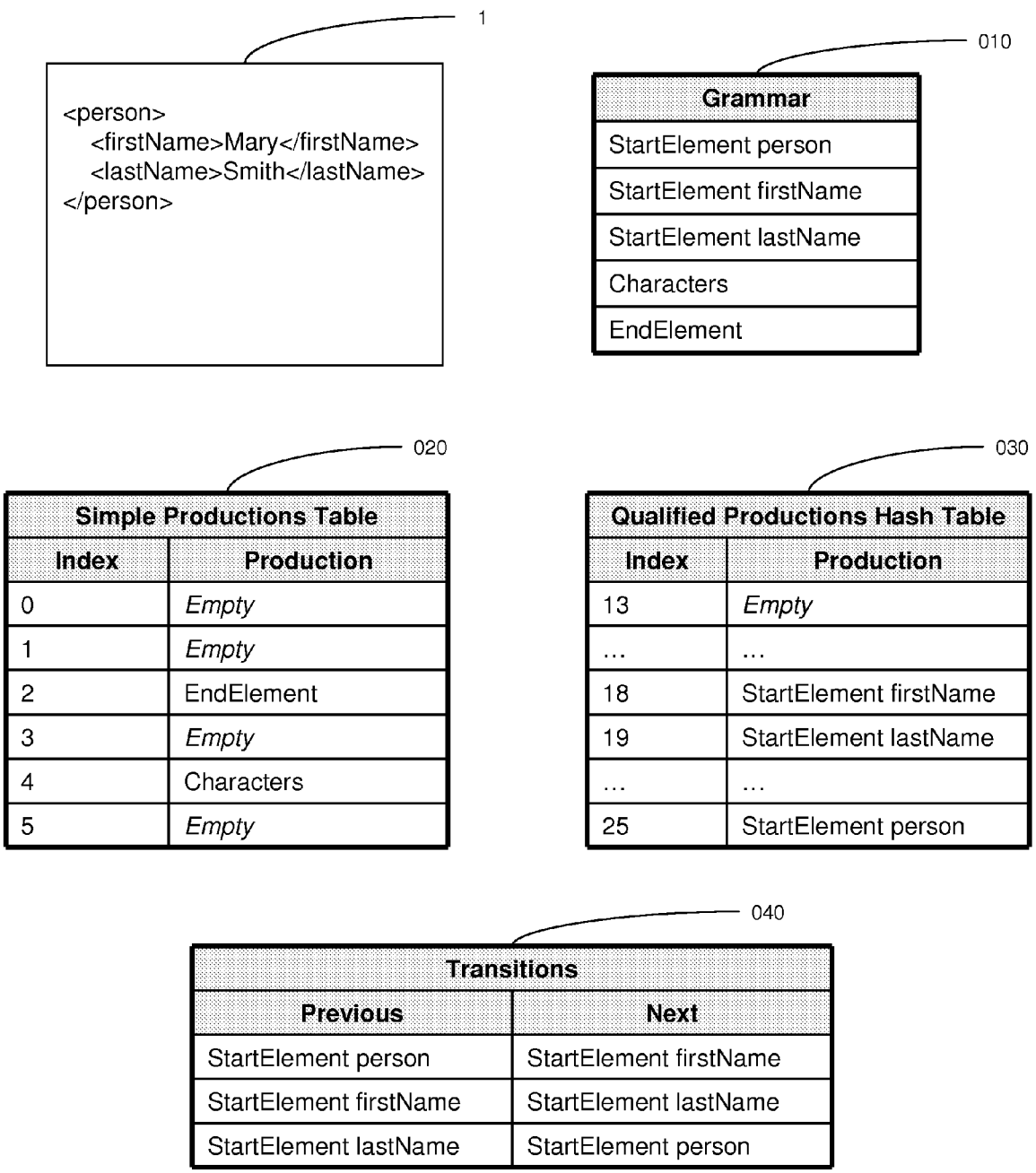
FIG. 1 illustrates grammars and structures for implementing an example embodiment of the invention.

The invention is first of all illustrated by an example embodiment using grammars and structures used as shown by FIG. 1. This example is described from the XML document 1 describing a person by means of a first name and last name.

This FIG. 1 gives an example of grammar and associated structures, these structures being used by the invention. The table 010 presents a grammar containing productions describing the following events: start of element person, start of element firstName, start of element lastName, characters (textual content) and end of element. The construction of this grammar does not relate to the invention.

It should be noted that this grammar describes by itself all the data, for the purpose of simplifying the example, but it is often interesting to proceed differently and for example to associate a grammar particular to each element (in this case one grammar for person, one for firstName and one for lastName). In this way, the information is separated, which is generally advantageous since thus each grammar defines solely the elements that actually have a chance of occurring. If the grammar of the example is considered, it would be possible to have a start of element person within an element firstName; however, this does not occur for the data of the example (it is the element person that contains the element firstName, and the contrary would not have any sense).

In the example of the document 1 in FIG. 1, the productions StartElement person, StartElement firstName and StartElement lastName are associated with a name, while the productions characters and EndElement are not.

In the remainder of this description two types of production are thus distinguished: simple productions and qualified productions. The so-called simple productions are productions that do not comprise or are not associated with a qualified name (unlike a production such as StartElement person). These productions are therefore characterized solely by a type of general event, this type of event being able to be designated by a name (for example end of element) or by a number. Though it is simpler when speaking to use names for designating elements, it is simpler, in computing, to use numbers, and the XML interfaces generally define a number for each event. In the case of StAX for example, the event called end of element is equivalent to the number 2 and the one called character is equal to 4.

Thus, when a type of event is considered for which the productions are not qualified, the number designating this event suffices to characterize it and it is therefore effective to obtain the production describing this event using this number as an index in a table. To this end, a table of simple productions is constructed, at the same time as each grammar associated with the document to be processed, each production being situated at the index equal to the number designating the event that it describes (the event end of element is designated by the number 2 and the production describing it is therefore situated at index 2 in this table). Such a table is illustrated by the table 020, where two events EndElement and Characters are seen at the respective indices 2 and 4.

A grammar does not necessarily contain a production for each type of XML event, and thus some cells of the table may remain empty. This does not pose any problem since this means that the events corresponding to these indices are not deemed to occur (the case of a use for verifying the conformity of an XML document for example). Where they do occur, a production creation and an updating of the table 020 may be provided for (the case of the compression of an XML document for example).

In FIG. 1, the table 020 of the simple productions comprises arbitrarily six cells but it may have more of them (as many as there exist types of XML event in the representation adopted for the application).

The advantage of such a table is to allow direct and effective access to the productions without additional calculation cost.

So-called qualified productions (such as StartElement person) are productions associated with types of data grouping together a type of general event and a specific property of this event, this property in this way defining a context. For these productions, a hash table is constructed (table 030). Unlike conventional mechanisms, the invention limits the filling of the hash table 030 with solely so-called qualified productions. Thus the table 020 is kept along with a more rapid processing of the events associated with the simple productions.

Moreover, if several types of qualified production are considered (productions StartElement designating starts of elements and productions Attribute designating attributes), it is advantageous to use as many hash tables as there are types of qualified production. A type of production relating to the productions relating to the same type of general event with different properties (contextual information). This is because the tables in question are then smaller and offer superior performance, for example a shorter access time to the productions.

However, these productions are regularly called in the same order (because of the redundancy of the XML file), and it is thus advantageous to keep the transitions between two of these productions.

To do this, another table is used. In this case, the table 040 represents the transitions from one qualified production to another. Just as it is advantageous to use one hash table per type of qualified production, it is advantageous to consider the transitions between qualified productions of the same type, that is to say from one start of element to another start of element, or from one attribute to another attribute. This is because, in this way, the different cases are separated in a more efficient way and a variation in the attributes, for example, then has no impact on the transitions between starts of elements. Processing by means of this table 040 is then more effective.

The transitions consist of a link from one production to another. According to the invention, when it is sought to predict the next production, the previous qualified production used for identifying the pertinent entry in the table 040 will be relied on. Various embodiments are possible: it is possible to add a property "next production" to each production, or to index the qualified productions and use a table in which, at the index of the previous production, the index of the following production is found.

According to the way in which the grammars are used, it may happen that productions are added dynamically (this is in particular the case in the binary XML format standardized by the EXI group of the W3C). In this case, it is necessary to update the various structures dynamically: if a simple production is added to the grammar, then it is also added to the simple production table 020, and in a similar manner for a qualified production the addition in the hash table 030 is proceeded with. In particular, in the case of the format standardized by the EXI group, it may happen that a new simple production is added although a simple production describing an event of the same type already exists. This occurs when it is wished to allocate a higher priority to a production (and therefore code it more effectively), and in this case a simple production of the same type and a lower priority will no longer be used. The new production can therefore take the place of the old one in the table of simple productions 020 without this posing any problem.

The processing according to the invention of the data of the XML document can be seen as follows.

When an event of the non-qualified type (simple event) is encountered, the corresponding index in the table 020 is calculated and the production to be applied for the processing of the data item is thus determined directly.

When a start of element is encountered (or any other event associated with a qualified production), it is possible, from the production used for the previous start of element (or for the previous type of data) and the table 040 of transitions, to predict the appropriate production.

On the first occasion, the predictions cannot be supplied since it is necessary to initialize the transitions, but subsequently if a start of element is encountered after a start of element person, it is predicted that it is necessary to use the production StartElement firstName.

To know whether the prediction is correct, it then suffices to check that the name of the start of element encountered is indeed firstName. If this is not the case the correct production is obtained by default via the hash table 030 and the corresponding conventional hash calculation. In this way the obtaining of the required production is guaranteed even in the case of erroneous prediction.

This structural configuration of the data offers flexibility in use in order to take account of new elements as the XML document is processed (the case of the compression of an XML file for example). For example a new element middleName may appear between firstName and lastName. Thus a new production associated with StartElement middleName is created and the table 040 of transitions is updated. In particular, the transition from StartElement firstName to StartElement lastName is perhaps no longer valid, and new transitions StartElement firstName→StartElement middleName
StartElement middleName→StartElement lastName are established.

It should be noted that no synchronization problem exists (unlike solutions based on simple static lists) since the new transitions make it possible to attach to already existing events in order to pursue the prediction event by event.

It should also be noted that updating a transition is very inexpensive and this makes it possible to adapt the predictions to the contents encountered, these contents being able to change within the same document. This solution, based on a routine updating of the transitions, gives excellent results in practice, unlike approaches based on statistical calculations intended for the working out of an expected sequence of productions, these approaches requiring more calculations and therefore more time.

However, it may be advantageous to define a slightly more expensive mechanism intended to no longer take account of a transition when this is not sufficiently often verified. Another variant consists of fixing a transition and no longer updating it so that it is valid in the most frequent case. These variants are described below.

Figure 2:
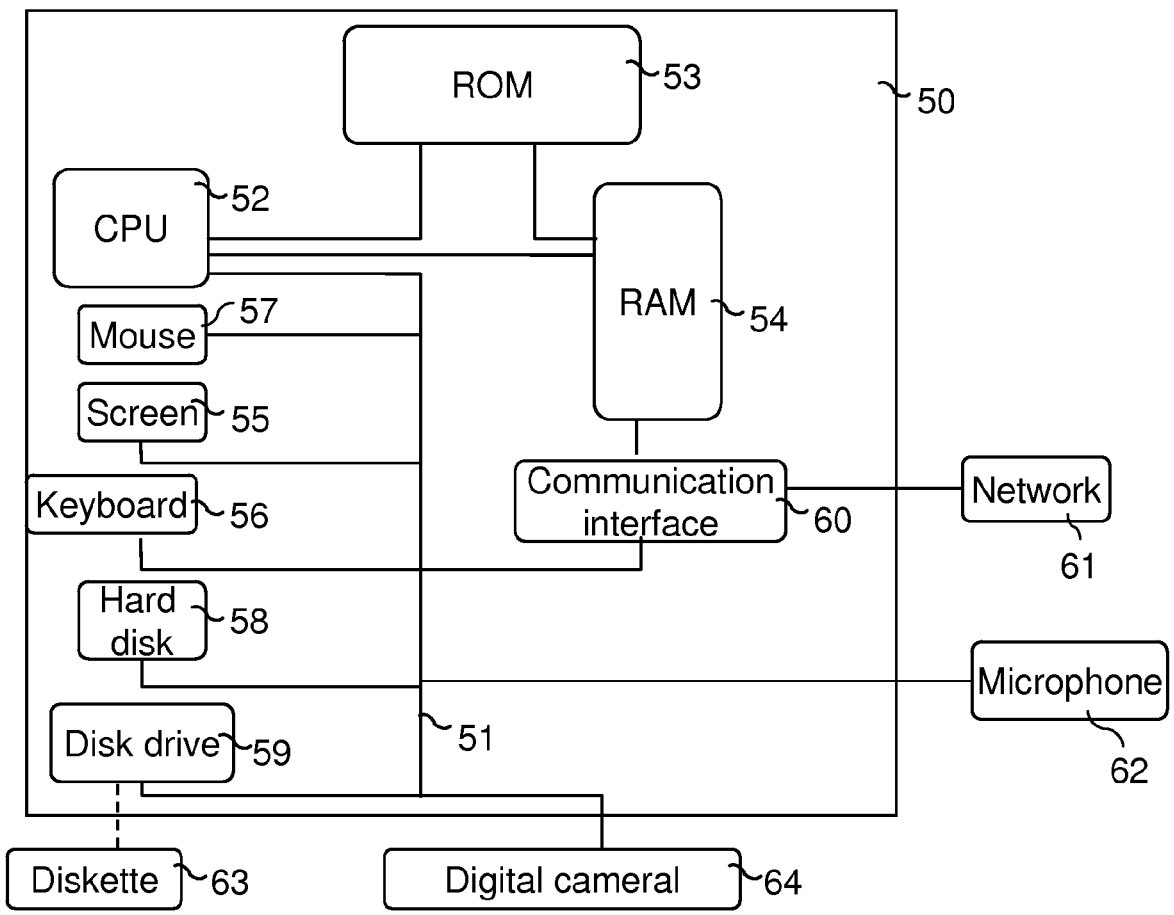
FIG. 2 shows a particular hardware configuration of an information processing device able to implement the method according to the invention.

With reference to FIG. 2, a description is now given by way of example of a particular hardware configuration of an information processing device able to implement the method according to the invention.

An information processing device implementing the invention is for example a microcomputer 50, a workstation, a personal assistant, or a mobile telephone connected to various peripherals. According to yet another embodiment of the invention, the information processing device is in the form of a photographic apparatus provided with a communication interface for allowing connection to a network.

The peripherals connected to the information processing device comprise for example a digital camera 64, or a scanner or any other image acquisition or storage means connected to an input/output card (not shown) and supplying multimedia data, possibly in the form of XML documents, to the information processing device.

The device 50 comprises a communication bus 51 to which there are connected:
- a central processing unit CPU 52 in the form for example of a microprocessor;
- a read only memory 53 in which the programs whose execution allows the implementation of the method according to the invention can be contained;
- a random access memory 54 which, after the powering up of the device 50, contains the executable code of the programs of the invention as well as registers adapted to record variables and parameters necessary for the implementation of the invention, in particular the tables and grammars of FIG. 1;
- a screen 55 for displaying data and/or serving as a graphical interface with the user, who can thus interact with the programs of the invention, by means of a keyboard 56 or any other means such as a pointing device, such as for example a mouse 57 or an optical pen;
- a hard disk 58 or a storage memory, such as a memory of the flash compact type, able to contain the programs of the invention as well as data used or produced during the implementation of the invention;
- an optional disk drive 59, or another removable data carrier reader, adapted to receive a diskette 70 and to read/write therein data processed or to be processed according to the invention; and
- a communication interface 60 connected to the telecommunication network 61, the interface 60 being able to transmit and receive data.

In the case of audio data, the device 50 is preferably equipped with an input/output card (not shown) connected to a microphone 62.

The communication bus 51 affords communication and interoperability between the various elements included in the device 40 or connected to it. The representation of the bus 51 is not limiting and, in particular, the central unit 52 is able to communicate instructions to any element of the device 50 directly or by means of another element of the device 50.

The diskettes 52 can be replaced by any information carrier such as for example a compact disk (CD-ROM), rewritable or not, a ZIP disk or a memory card. In general terms, an information storage means able to be read by a microcomputer or microprocessor, integrated or not in the information processing device, possibly removable, is adapted to store one or more programs whose execution enables the method according to the invention to be implemented.

The executable code enabling the information processing device to implement the invention can be stored either in read only memory 53, on the hard disk 58 or on a removable digital medium such as for example a diskette 63 as described previously. According to a variant, the executable code of the programs is received by means of the telecommunication network 61, via the interface 60, in order to be stored in one of the storage means of the device 50 (such as the hard disk 48 for example) before being executed.

The central unit 52 controls and directs the execution of the instructions or portions of software code of the program or programs of the invention, the instructions or portions of software code being stored in one of the aforementioned storage means. When the device 50 is powered up, the program or programs that are stored in a non-volatile memory, for example the hard disk 58 or the read only memory 53, are transferred into the random access memory 54, which then contains the executable code of the program or programs of the invention, as well as registers for storing the variables and parameters necessary for implementing the invention.

It should also be noted that the device implementing the invention or incorporating it can also be produced in the form of a programmed apparatus. For example, such a device can then contain the code of the computer program or programs in a form fixed in an application specific integrated circuit (ASIC).

The device described here and, particularly, the central unit 52 is able to implement all or some of the processing operations described in relation to FIGS. 1 and 3 to 7b in order to implement the method that is the object of the present invention and constitute the device that is the object of the present invention.

Figure 3:
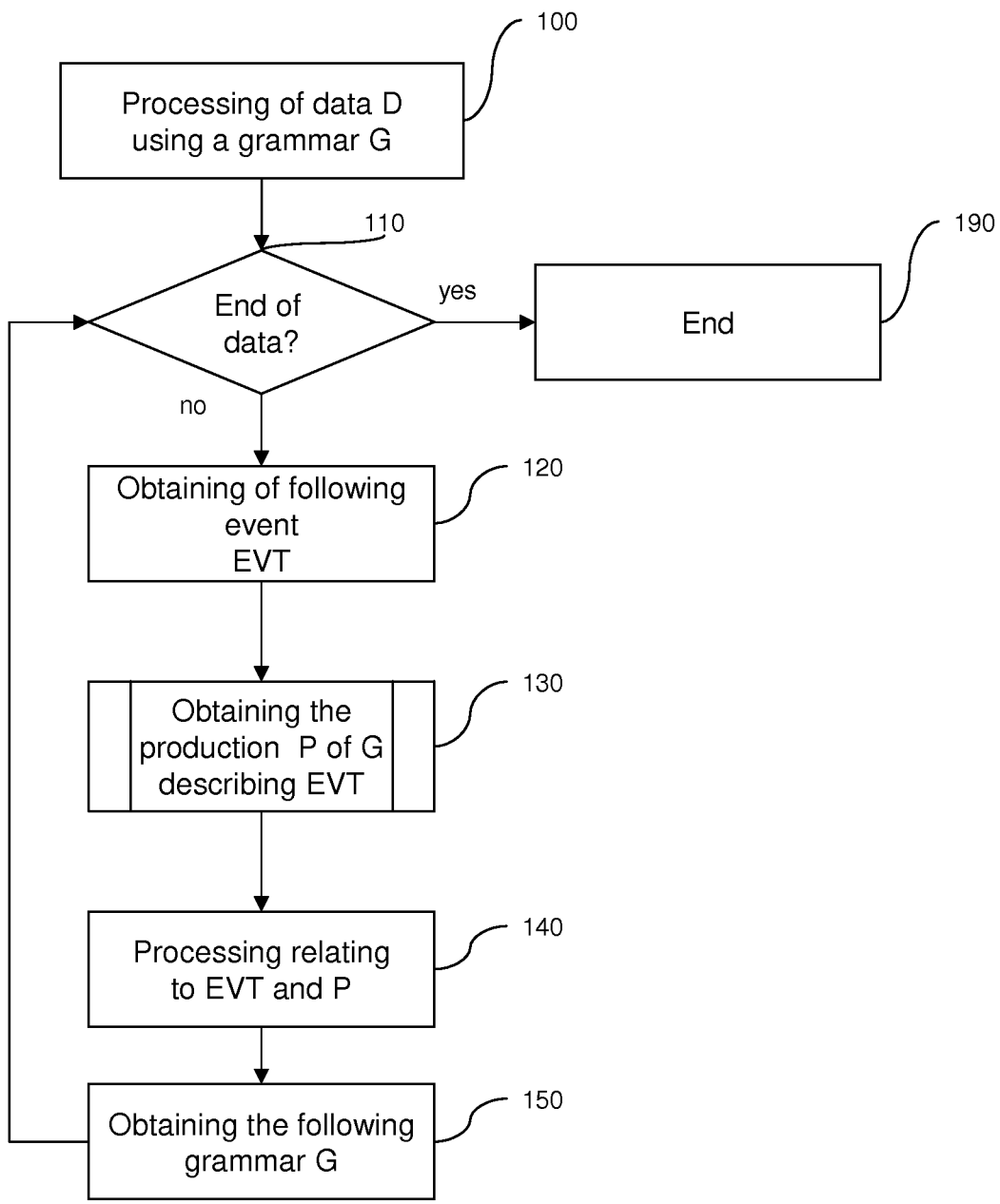
FIG. 3 depicts, in the form of a logic diagram, an example of processing data according to the invention.

Steps for processing a structured document, for example XML, are proposed with reference to FIG. 3.

At step 100, structured data D of the document 1 and a grammar G are recovered. This data and grammar are obtained by an application wishing to carry out a processing on this data by means of this grammar, for example the validation of this data with respect to an XML schema, or the compression thereof. As stated previously, during this processing, the data is seen as events and it is necessary to find the production P describing each event in question in order to carry out one of the aforementioned processing operations.

At step 110, it is assessed whether the end of the data has been reached.

In the affirmative (output YES), the processing ends at step 190.

In the negative (output NO), a following event EVT is obtained at step 120 by means of a module for extracting data from the document, for example an XML parser.

At step 130, considering the event extracted, a production P of G describing this event is recovered. It should be remarked that the production P may be null if no suitable production has been found. In this case, the required purpose is adapted to in order to produce suitable complementary information. To take the example of XML validation, if no suitable production is found, this may mean that the data is not in conformity with the schema. In the example of encoding/compression, a corresponding production is then created from a default production.

At step 140, the processing relating to the event EVT and to the production P is carried out.

Then the following grammar G is obtained at step 150, in the case where several grammars are provided for each element. It may happen that the following grammar is the same as the current grammar, this depends on the grammars that are used and the production P in question. In the case where P corresponds to the start of an element, it is normal for the following grammar to be the grammar associated with this element.

Step 110 is then returned to in order to proceed with the processing of the other data of the document.

Figure 4:
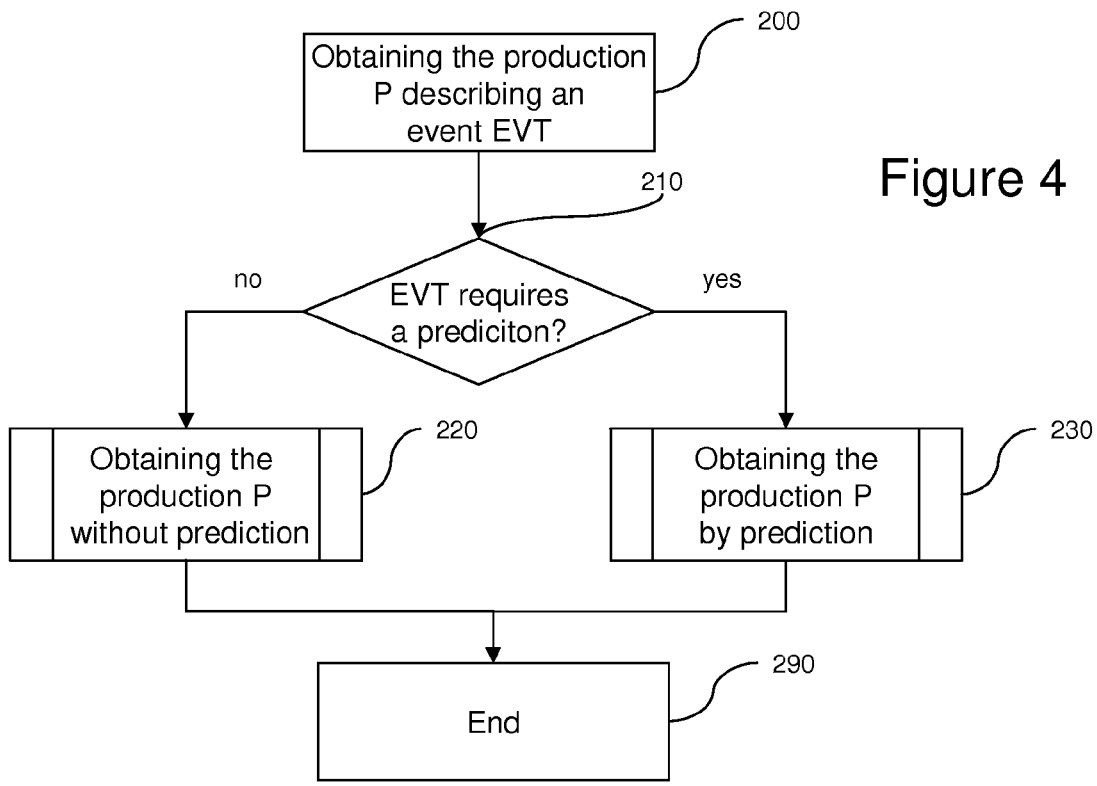
FIG. 4 depicts, in the form of a logic diagram, steps of obtaining a production used in the process in FIG. 3.

Step 130 of recovery/obtaining of production P of G describing the extracted event EVT is now described in more detail with reference to FIG. 4.

Starting from the event EVT (step 200), the first step, step 210, is to determine whether the event EVT requires a prediction.

This determination depends in particular on the context in which the extracted event EVT fits and therefore the type of event concerned. Thus, if it is a case of a type of event described by a simple production (for example an event that does not have a property specific to a context, in particular an event that is not defined by a name in addition to its type), the invention proposes processing without prediction. If on the other hand it is a type of event described by a qualified production and therefore having a property that is taken account of, for example the name, the invention then proposes a prediction.

As will be seen subsequently, in particular in relation to FIGS. 7a and 7b, it may be agreed, in some situations, not to proceed with the prediction of a qualified production (a production referred to as "opaque"). The corresponding information may be contained in a stored value, for example a ratio.

If it is not necessary to determine a prediction, step 220 is passed to, during which there is obtained the production P sought without prediction, as described below in relation to FIG. 5.

Conversely, if a prediction is necessary, the production P is obtained by making a prediction at step 230, as described below in relation to FIG. 6.

In both cases, the processing then ends at step 290.

Figure 5:
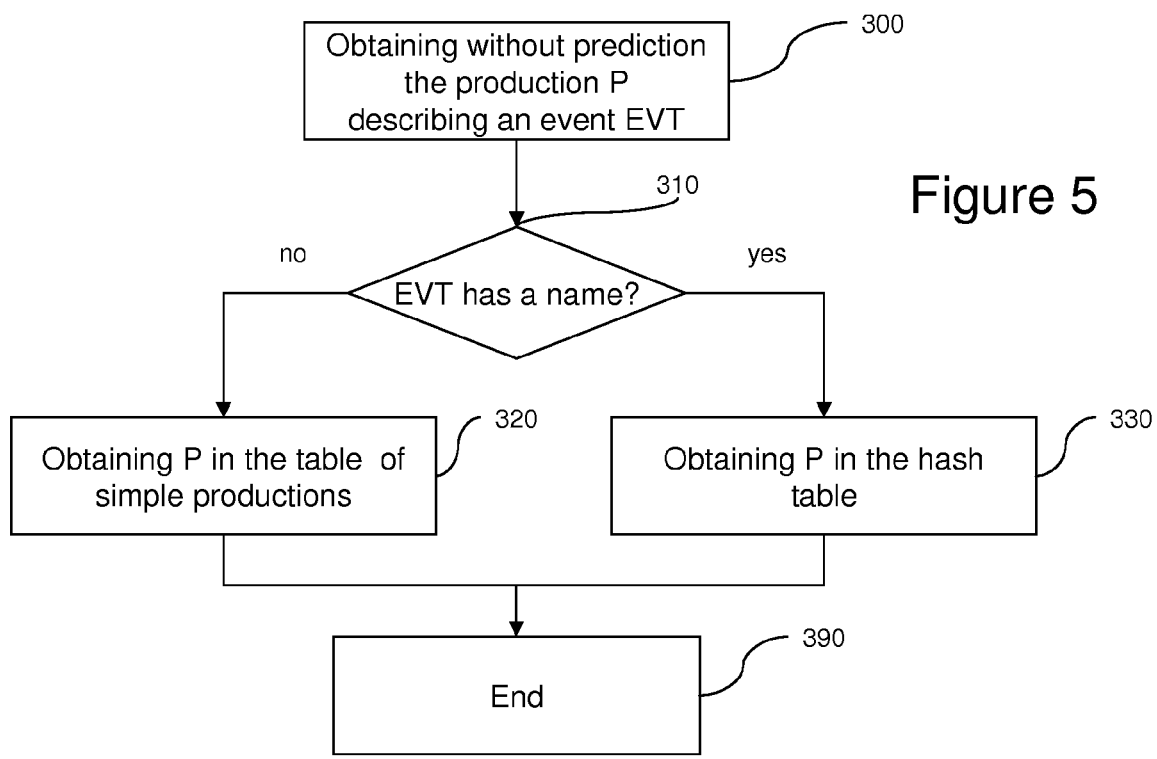
FIG. 5 depicts, in the form of a logic diagram, steps of obtaining a production without prediction used in the process in FIG. 4.

The obtaining of a production P without prediction is illustrated by FIG. 5.

Two cases are to be distinguished according to whether the event corresponds to a simple or qualified production. Thus, at step 310, it is determined whether the event to be processed is qualified, that is to say in the example whether it bears a name.

In the negative (output NO), that is to say if the event corresponds to a simple production, the production is obtained, at step 320, by using the table of simple productions 020 linked to the grammar G in question and the type of event EVT (in the form of a number). To this end, in the case where the data is processed according to the StAX model, the StAX value of the event in question is determined and the entry for the table 020 corresponding to the index of the same StAX value is read.

In the affirmative (output YES), that is to say when the event corresponds to a production termed for example "opaque", the production is obtained at step 330 by virtue of the conventional mechanisms, typically by the calculation of a hash value from the event to be processed and by the recovery of the production in the hash table 030 linked to the grammar G and corresponding to the index equal to the hash value.

In both cases, the processing then ends at step 390.

Figure 6:
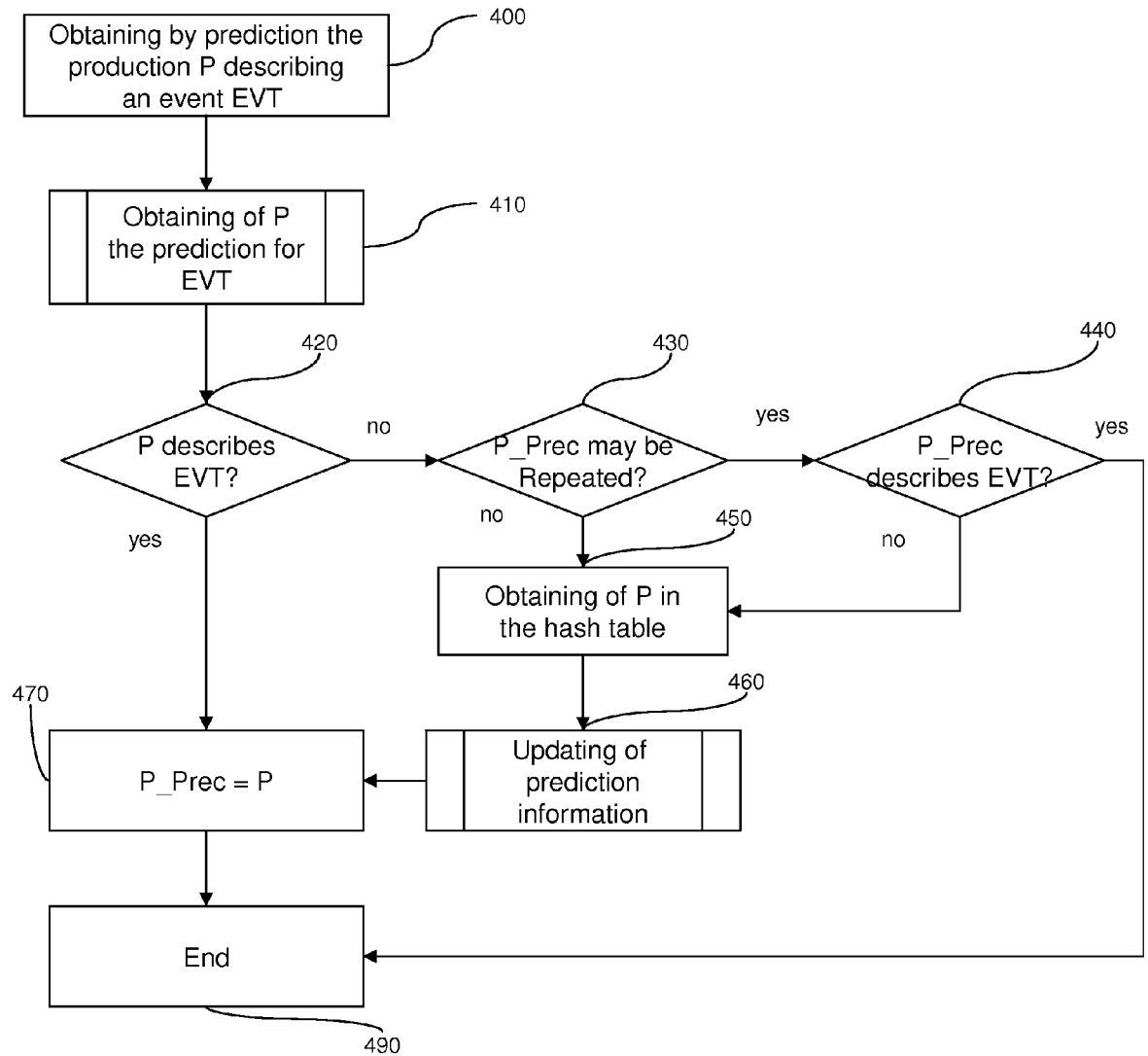
FIG. 6 depicts, in the form of a logic diagram, steps of obtaining a production by prediction used in the process in FIG. 4.

The obtaining of a production P with prediction is illustrated by FIG. 6.

Starting from the event EVT at step 400, the first step is to obtain, at step 410, the production P that is the result of the prediction and illustrated below in relation to FIG. 7*a*.

This obtaining involves the previous production used (the one determined during the processing of the previous event or of the previous event of the same type of step 120), which is subsequently denoted P_Prec.

It should be emphasized that, in the case where the various types of qualified productions are managed separately (separation between starts of elements and attributes), the previous production is kept for each type of qualified production (previous production of the StartElement and previous production of the Attribute type).

Thus, at step 420, it is assessed whether the production P obtained at step 410 describes the event EVT, which consists, in the example, of verifying that the name associated with the event EVT and the name qualifying the production P are indeed the same.

Depending on the way in which the predictions are constructed, it may also be necessary to verify that the types of EVT and P coincide but, if the predictions relating to each type of event are processed separately, then this is not necessary. In concrete terms, if the transitions between productions StartElement and the transitions between productions Attribute are managed separately, a transition is necessarily between two productions StartElement or between two productions Attribute (rather than between a production StartElement and a production Attribute), and consequently, if a production StartElement is predicted, it is certain that the result is another production StartElement.

In the case of correct prediction (output YES), it is indicated that, at the time of the next prediction, it will be necessary to use P as the previous production; that is to say the prediction obtained at step 410 is stored, at step 470, as the previous production P_Prec.

The processing then ends at step 490. The processing of step 140 is thus carried out by means of the production P, also stored in P_Prec.

In the case of incorrect prediction (output NO), it is determined at step 430, whether the previously used production can be repeated, by means of a flag provided for this purpose in the production.

The fact that a qualified production is repeated means that, for a given grammar, the same qualified production is used several times one after the other in the document. This is for example the case if there is a list of persons: this is because, in the grammar containing the production describing the start of the person element, this production is used first of all, and then the one designating the end of element (simple production), and once again the one designating the start of the person element. From the point of view of the qualified productions, it is therefore found that the production StartElement person is repeated at the level of this grammar (only the qualified productions of this grammar are taken into account, and any qualified productions used for the content of the person element are not concerned—they relate to another grammar (the one describing the content of the person element)).

It is advantageous to detect the productions that are repeated and to treat them independently of the predictions since it regularly happens that an element is repeated a certain number of times (this number being able to be variable) and then that another element succeeds it. There are then two different types of transition: firstly transitions of the element that is repeated to itself: secondly a transition of the element that is repeated to the (distinct) element that succeeds it. By processing the repetitions independently, the possibility of defining a transition to another element is kept whilst effectively treating the case where the transition is not valid.

According to the invention, the transitions to another element are then stored by means of the table 040 and the repetitions by means of an indicator, for example a flag, provided at each concerned production, as described below.

If the production previously used may be repeated (output YES at step 430), it is determined at step 440 whether it describes the event in question.

In the affirmative (output YES at step 440), the production sought is found and the processing then ends at step 490. The processing of the step 140 is thus carried out by means of the production P, also stored in P_Prec. It should be noted in fact that it is not necessary to parameterize P as the last production used since P_Prec is already equal to P.

In the negative (output NO at step 440) or if the production previously used cannot be repeated (output NO at step 430), the processing continues at step 450 by the obtaining of the production P, in a conventional fashion, via the hash table 030.

This then continues with the updating of prediction information, during step 460 as described below in relation to FIG. 7*b*.

The production P is then taken into account as the next previous production to be used for the prediction relating to the following event.

The processing then ends at step 490. The processing of step 140 is thus carried out by means of the production P, also stored in P_Prec.

Figure 7A:
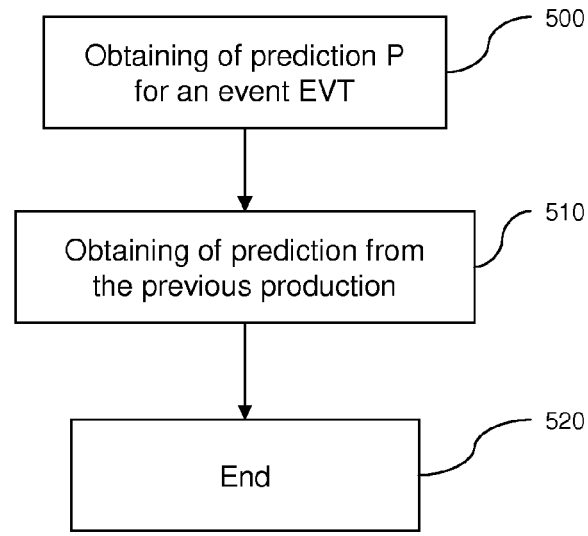
FIGS. 7a and 7b depict, in the form of logic diagrams, steps of processing the predictions used in the process in FIG. 6.
Figure 7B:
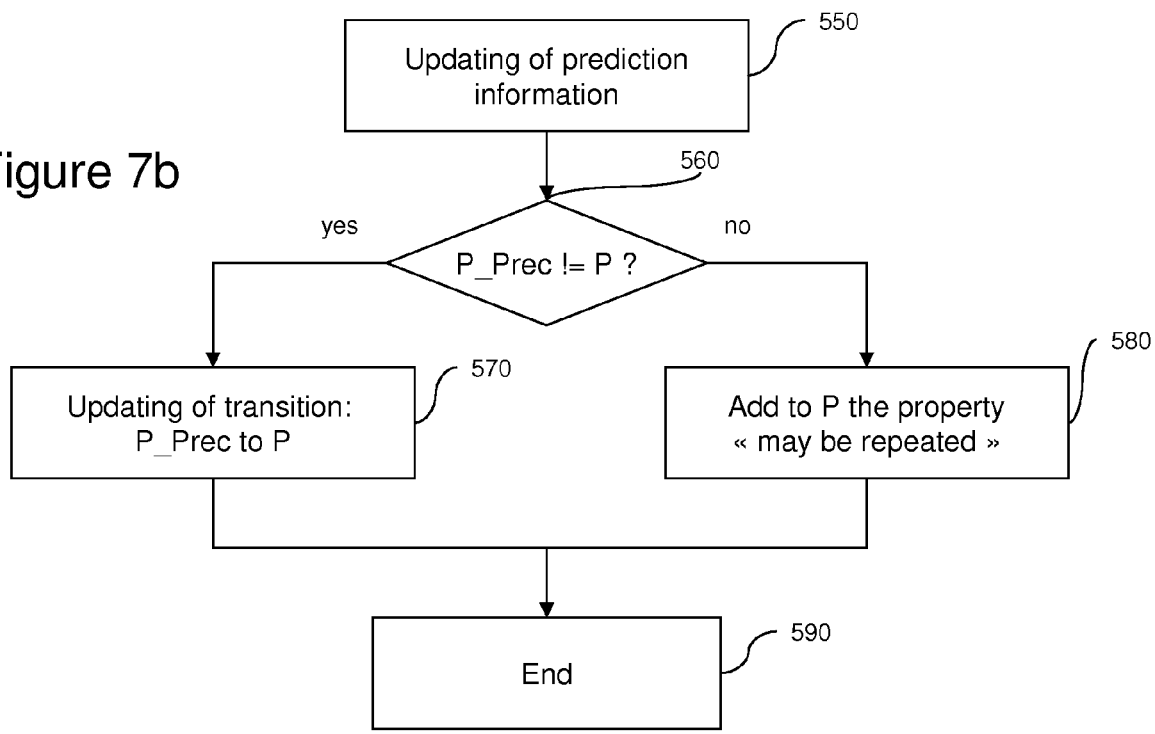

FIGS. 7*a* and 7*b* present the processing of the predictions with on the one hand the obtaining of a prediction (FIG. 7*a*) and on the other hand the updating of the prediction information (FIG. 7*b*).

With regard to the obtaining of the prediction P for an event EVT, the starting point is the event EVT and the previous production P_Prec at step 500.

It is presented here how the predicted production is obtained from the previous production during step 510.

The way of obtaining the predicted production depends on the way in which the transitions between productions are managed: if a property "following production" is used for each production, then it is this production indicated in the production P_Prec that is the prediction. If a table of transitions 040 is used where the productions are indexed and where, at the index of each production, the following predicted production is found, then it is sought to obtain the index of the previous production P_Prec and, from this, to obtain the predicted production corresponding to the following production that is associated with it in the table. In the case of the table with index, rather than keeping the previous production, it is more advantageous to keep only its index in P_Prec.

The processing then ends at step 520.

With regard to the updating of the prediction information of step 460, the first step is the comparison, at step 560, of the previous production P_Prec with the current production P that describes the current event.

In the case of different productions (output YES at step 560), this means that the transition concerning P_Prec is not valid, and this transition is therefore updated so that P_Prec leads to P (step 570). This updating can be subject to conditions such as for example a sufficient number of occurrences of this transition or a ratio of this transition with respect to a concurrent transition (two transitions are concurrent when they start from the same production but are intended for different productions) greater than 1. It is also possible to make provision for fixing a transition once and for all without allowing it to be replaced by a concurrent transition.

This new-transition information will be used the next time that it is necessary to obtain a prediction from P_Prec.

The processing then ends at step 590.

In the case of identical productions (output NO at step 560), this means that the same production is used several times in succession in the grammar in question. There is therefore added, at step 580, to this production the information that it may be repeated, for example by changing a flag indicator from a null position "0" to an active position "1", in order to be able to process the cases of repetition effectively.

Then the processing ends at step 590.

In a variant, it is sought to manage a property of opacity of the productions. The principle of opacity consists of considering a production or transition to be opaque when the prediction made from this production is not sufficiently often correct. In this case, a prediction is not made.

One way of managing the opacity consists of taking into account for a production the number of predictions made and the number of failures encountered. This means that, at step 510, a counter associated with the production that represents the number of predictions made is incremented: in addition, instead of updating the transition (step 570) routinely in the case where the previous production and the current production differ, it is then necessary to begin by incrementing the counter for the prediction failures and then comparing the failure rate with a predetermined threshold as from which a production must become opaque.

The gain in efficacy obtained by the use of the transitions being of the order of 5 to 10 (this depends on the data processed and the implementation, in particular concerning the hash tables used), it is possible for example to take a threshold of 80% failures as a minimum threshold for defining a production as being opaque.

It is advantageous to define a minimum number of predictions made before taking account of the failure rate, since this rate may for example be 100% in the case of failure for the first prediction without this being representative of all of the data (all the following predictions may be correct). A threshold of 10 predictions made may be a good level.

Other solutions are possible for managing opacity, for example by taking account solely of the number of failures and fixing an absolute threshold (it is decided for example that, after 10 failures, the production becomes opaque).

It should be noted, however, that the management of opacity involves an additional cost in the prediction method, and this therefore slows down the obtaining of this prediction. In the case where a production becomes opaque, the gain in time procured by the non-calculated predictions may be greater than the loss of time occasioned by the management of opacity; however, as a general rule, it is found that it is more advantageous not to take the opacity into account.

If on the other hand there is a particular knowledge about the data that will be processed, this knowledge making it possible to assume that a certain number of predictions are not advantageous to calculate since the corresponding data is particularly irregular, then it is possible to choose to use the opacity. For this reason, it is advantageous to integrate the opacity solely as an option, this option being able to be activated or deactivated by means of an interface defined by the application.

The above examples are merely embodiments of the invention, which is not limited by them.

The invention claimed is:

1. A method of accessing a production among a plurality of productions of at least one grammar, comprising the step of using a device for processing a structured electronic XML document to perform the steps of:
    a) storing productions forming a set of rules for constructing hierarchical data of the structured electronic XML document, said plurality of productions comprising a first group of productions associated with a first group of events and each production of the first group being defined for an event type and contextual information including a name associated with an element in the hierarchical data, and a second group of productions associated with a second group of events distinct from the first group of events, said events describing the hierarchical data of the structured electronic XML document;
    b) determining whether an event in question is of the first group including determining whether the event in question is defined by a name associated with an element in addition to an event type;
    c) predicting a production from the first group that is associated with said event in question in the event step that step b) determines that the event in question is of the first group; and
    d) determining that the event in question is solely defined by an event type, and determining a production from the second group that is associated with the event in question by calculating identification data for said event in question and by recovering a production in a table including productions of the second group from said calculated identification data in the event step that step b) determines that the event in question is not of the first group.

2. A method according to claim 1, further comprising a step of verifying said prediction.

3. A method according to claim 2, further comprising, in the event that step b) determines that the event in question is not of the first group, a step of determining a production by means of a hash table.

4. A method according to claim 2, further comprising, in the event that step b) determines that the event in question is not of the first group, a step of updating of prediction information.

5. A method according to claim 1, wherein the productions of the second group are stored in a table, each at an index corresponding to said identification data.

6. A method according to claim 1, wherein said contextual information comprises a qualified name.

7. A method according to claim 1 of processing an electronic document comprising hierarchical data organized in a plurality of elements able to be described by a set of events using
    at least one grammar comprising productions, said method comprising:
    i) a step of extracting an event to be processed; and
    ii) a step of accessing a production associated with said event to be processed.

8. A method according to claim 7, wherein steps i) and ii) are reiterated for a plurality of events of said document.

9. A method according to claim 8, wherein the grammar comprises at least one transition associating a preceding production of the first group with a following production of the first group, said prediction at step c) comprising, based on the at least one transition, the determination of a following production associated with a production describing an event processed during a preceding iteration.

10. A method according to claim 9, wherein the events of said document are grouped together in various types, said prediction of an event of one type being made from the production associated with the last event of the same type that has been processed.

11. A method according to claim 9, wherein said accessing step comprises, in the event that step b) determines that the event in question is not of the first group, a step of determining a production by means of a hash table and of updating prediction information, and wherein said updating comprises the storage of a transition associating the production associated with the previously processed event with the production determined by means of the hash table.

12. A method according to claim 9, further comprising a step of inactivating the a transition when several iterated predictions from the same preceding production are wrong.

13. A method according to claim 8, wherein said accessing step comprises a step of verifying said prediction, and:
  a) in the event that the prediction is not verified it is determined whether the production associated with the previously processed event may be repeated, and
  b) in the event case of a positive determination at step a), the event associated with the previously processed production is compared with the extracted event.

14. A method according to claim 13, wherein, in the case of negative determination at step a) or a negative comparison at step b), a production associated with the extracted event is determined from a hash table.

15. A method according to claim 14, further comprising a step of comparing the production associated with the previously processed event with the production obtained from the hash table and a step of updating a repetition indicator in said production in the case of positive comparison for comparing the production associated with the previously processed event with the production obtained from the hash table.

16. A device for access to a production among a plurality of productions of at least one grammar, said device comprising:
  a unit configured to store the productions, the productions forming a set of rules for constructing hierarchical data of a structured electronic XML document, said plurality of productions comprising a first group of productions associated with a first group of events and each production of the first group being defined for an event type and contextual information including a name associated with an element in the hierarchical data, and a second group of productions associated with a second group of events distinct from the first group of events, said events describing the hierarchical data of the structured electronic XML document;
  a first determination unit configured to determine whether an event in question is of the first group by including determining whether the event in question is defined by a name associated with an element in addition to an event type;
  a prediction unit configured to predict a production from the first group that is associated with the event in question in the event that the first determination unit determines that the event in question is of the first group; and
  a second determining unit that determines the event in question is solely defined by an event type, and determines a production from the second group that is associated with the event in question by calculating identification data for said event in question and by recovering a production in a table including productions of the second group from said calculated identification data in the event that the first determining unit determines that the event in question is not of the first group.

17. A device according to claim 16, wherein the grammar comprises transitions associating a preceding production of the first group with a following production of the first group, the prediction unit being configured to determine the following production associated with a production describing a previously processed event.

18. A device according to claim 17, wherein the prediction unit comprises at least one table referencing said transitions.

19. A device according to claim 17, wherein at least one production references a following production so as to implicitly form one of said transitions.

20. A device according to claim 16, further comprising a third determination unit configured to determine production associated with an event of the second group, said third determination unit comprising a table associating, with identification data for an event, a production describing said event.

21. A device according to claim 16, wherein the contextual information comprises a qualified name.

22. A method according to claim 1, wherein an information storage device, at least partially removable, configured to be read by a computer system, comprising instructions of a computer program when the program is loaded and executed by the computer system.

23. A method according to claim 1, wherein a computer program stored on a computer-readable storage device for being read by a microprocessor, comprising portions of software code when loaded and executed by the microprocessor.

* * * * *